(12) United States Patent
Cooper

(10) Patent No.: US 10,795,141 B2
(45) Date of Patent: Oct. 6, 2020

(54) LED ILLUMINATION IN MICROSCOPY

(71) Applicant: CYTIVA SWEDEN AB, Uppsala (SE)

(72) Inventor: Jeremy R. Cooper, Issaquah, WA (US)

(73) Assignee: Cytiva Sweden AB, Uppsala (SE)

( * ) Notice: Subject to any disclaimer, the term of this patent is extended or adjusted under 35 U.S.C. 154(b) by 0 days.

(21) Appl. No.: 15/533,686

(22) PCT Filed: Dec. 18, 2015

(86) PCT No.: PCT/EP2015/080457
§ 371 (c)(1),
(2) Date: Jun. 7, 2017

(87) PCT Pub. No.: WO2016/102354
PCT Pub. Date: Jun. 30, 2016

(65) Prior Publication Data
US 2017/0343786 A1    Nov. 30, 2017

Related U.S. Application Data

(60) Provisional application No. 62/095,161, filed on Dec. 22, 2014.

(51) Int. Cl.
*G02B 21/06* (2006.01)
*G02B 17/00* (2006.01)
(Continued)

(52) U.S. Cl.
CPC ........... *G02B 21/06* (2013.01); *G02B 17/004* (2013.01); *G02B 19/0028* (2013.01);
(Continued)

(58) Field of Classification Search
CPC .......... G02B 21/06; G02B 5/04; G02B 17/00; G02B 17/004; G02B 19/00;
(Continued)

(56) References Cited

U.S. PATENT DOCUMENTS 5,537,162 A * 7/1996 Hellmuth ............... A61B 3/102
351/206
6,356,700 B1 * 3/2002 Strobl .................. G02B 6/0006
359/859

(Continued)

FOREIGN PATENT DOCUMENTS

JP      2005091491 A     4/2005

OTHER PUBLICATIONS

PCT International Search Report and Written Opinion for PCT Application No. PCT/EP2015/080457 dated Apr. 3, 2016 (9 pages).

*Primary Examiner* — Jie Lei
(74) *Attorney, Agent, or Firm* — Eversheds Sutherland (US) LLP

(57) ABSTRACT

Disclosed is an LED arrangement for a microscopy instrument (200 FIG. 2) comprising a light emitting area (112), and a part-spherical solid and light transmissive cap (120), in light communication with the light emitting area, the cap having a hemispherical surface (126) including a portion (124) at which light from the light emitting area is reflected and a portion (128) at which light from the emitter can exit the cap, in order to provide a usable light cone L which includes light recycled from the more divergent emitted light, and is thereby more intense.

14 Claims, 3 Drawing Sheets

(51) Int. Cl.
  *G02B 19/00* (2006.01)
  *H01L 33/46* (2010.01)
  *H01L 33/58* (2010.01)
  *H01L 33/60* (2010.01)

(52) U.S. Cl.
  CPC .......... *G02B 19/0061* (2013.01); *H01L 33/46* (2013.01); *H01L 33/58* (2013.01); *H01L 33/60* (2013.01)

(58) Field of Classification Search
  CPC . G02B 19/0061; G02B 19/0028; H01L 33/58; H01L 33/46; H01L 33/60
  USPC ......... 359/385, 856; 351/221, 243; 362/243, 362/307, 296.01, 555
  See application file for complete search history.

(56) References Cited

U.S. PATENT DOCUMENTS

2007/0291491 A1   12/2007  Li et al.
2010/0045937 A1    2/2010  Li
2012/0051042 A1    3/2012  Artsyukhovich et al.
2012/0281417 A1* 11/2012  Sun ........................ H01L 33/60
                                        362/296.01

\* cited by examiner

LED ILLUMINATION IN MICROSCOPY

CROSS REFERENCE TO RELATED APPLICATIONS

This application claims the priority benefit of PCT/EP2015/080457 filed on Dec. 18, 2015 which claims priority benefit of U.S. Provisional Patent Application No. 62/095,161 filed Dec. 22, 2014. The entire contents of which are hereby incorporated by reference herein.

FIELD OF THE INVENTION

The present invention relates to the generation of increased useable light from a light emitting diode (LED) for illumination purposes in microscopy, particularly, but not exclusively fluorescence microscopy.

BACKGROUND OF THE INVENTION

Light microscopy, and in particular fluorescence light microscopy, relies on an intense source of illumination light that can be focused down to a very small cross section within the sample plane field of view. The intensity of the focused illumination spot is a key factor in determining the brightness of an image and the speed at which that image can be collected. LED's are a bright and easily controllable light source for microscopy, however, their substantial emitter size (1-3 millimetres across) and divergent emitted light make it impossible to focus more than about 5-10% of the total available emitted light down to the sample field of view. Due to the constraints of etendue and the limited numerical aperture (NA) of microscopy objective lenses, only the central cone of an LED's Lambertian emission profile can be collected by the objective lens.

A prior attempt at increasing the light output from LEDs is described in U.S. Pat. No. 7,898,665, which describes arranging multiple LEDs and bringing their light into a single beam. This technique employs a complicated spatial arrangement of LEDs and optics which would be costly to implement.

A further attempt is shown in U.S. Pat. No. 6,960,872, wherein a rectilinear box contains one or more LEDs and a reflective inner surface of the box reflects some light eventually out of an aperture. From there, the light exiting the aperture is focused by a lens or prism. This technique will cause much of the LED output light to be reflected many times, which will reduce the efficiency of the arrangement significantly.

Yet another attempt is described in U.S. Pat. No. 6,144,536, wherein a cylindrical shell is formed around a light source, again having a reflective inner surface. Light exits the shell and is internally reflected along light path to form a diffuse illuminated area.

Whilst these attempts might collect more light than could otherwise be collected from the bare semiconductor junction, they lack simplicity and their application to microscopy is of limited utility because the light from an LED source needs to be efficiently captured and focused in a limited volume, confined by other essential microscope components, and without causing dark spots or other light aberrations from the complicated arrangements described in the prior art above.

The inventor has realised that there is a need to utilise a higher percentage of the LED's emission profile in a simple way, and thereby enable brighter microscopy images and shorter exposure times at low cost.

SUMMARY OF INVENTION

In embodiments the above problems are addressed herein by the provision of an improved LED light arrangement, for example, including a light emitting area, the light emitting area being in light communication with a substantially part-spherical solid cap (i.e. a portion of a ball) at a flat surface of the cap, the cap having a generally mirrored or otherwise light reflective curved surface including a region of the curved surface which is not mirrored allowing light from the emitting area to escape in use.

The practice, embodiments of the invention utilise a reflective layer surrounding the LED that redirects all but the central cone of emitted light back onto the LED itself. In this way, emitted light that lies within the central cone of the emission profile will proceed towards the microscope lens system, but the rays that lie outside of this cone will become redirected (through one or more reflections) until they emerge along a trajectory that lies within this central, usable cone. In this way virtually all the LED's light can be used, by virtue of a low cost and small size arrangement.

The invention provides an LED arrangement according to claim 1 having preferred features defined by claims dependent on claim 1, as well as a microscopy device employing the arrangement.

The invention extends to any combination of features disclosed herein, whether or not such a combination is mentioned explicitly herein. Further, where two or more features are mentioned in combination, it is intended that such features may be claimed separately without extending the scope of the invention.

BRIEF DESCRIPTION OF THE DRAWINGS

The invention can be put into effect in numerous ways, illustrative embodiments of which are described below with reference to the drawings, wherein.

DETAILED DESCRIPTION OF THE INVENTION

Figure 1:
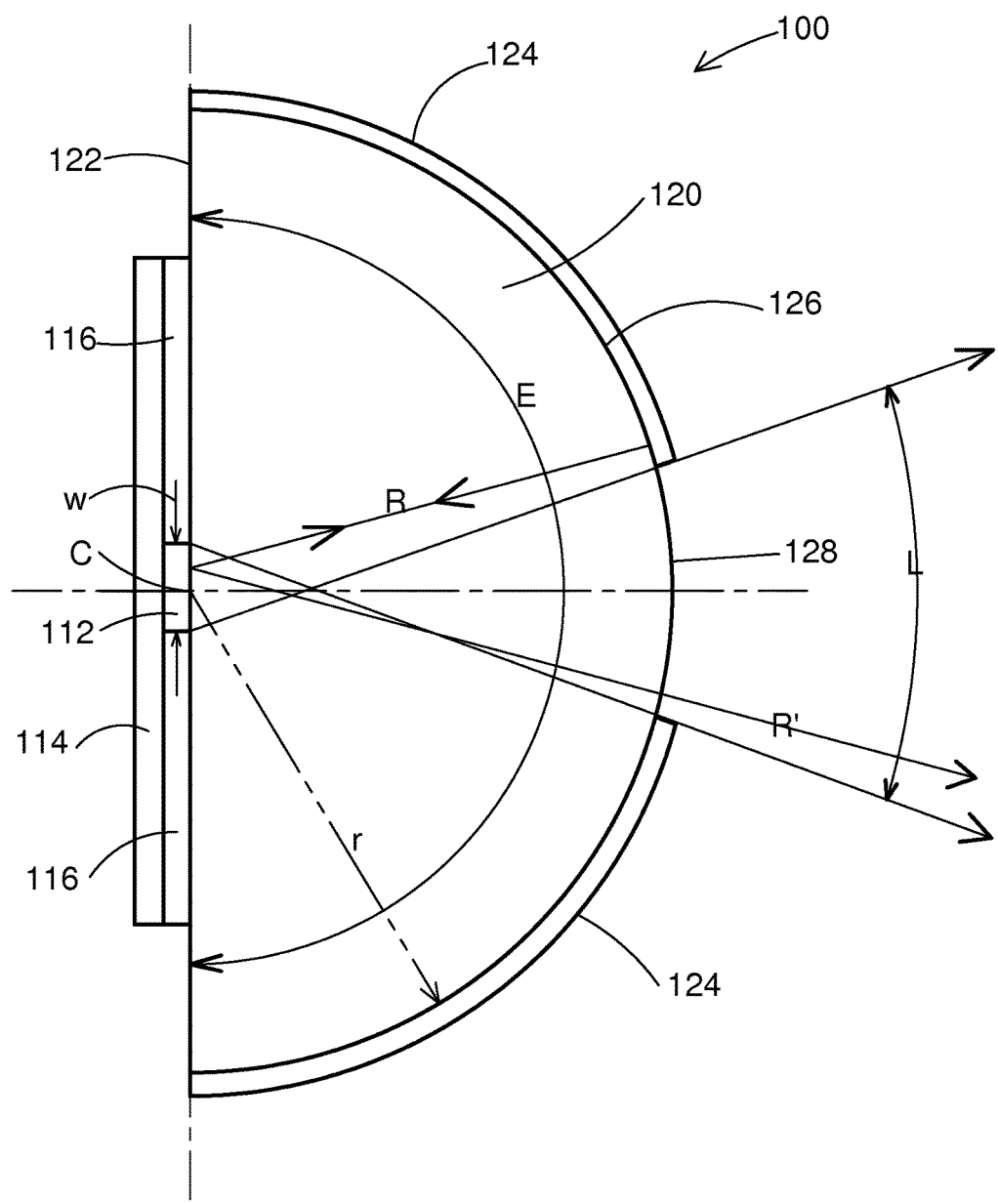
FIG. 1 shows an LED arrangement.

The invention, together with its objects and the advantages thereof, may be understood better by reference to the following description taken in conjunction with the accompanying drawings, in which like reference numerals identify like elements in the Figures.

FIG. 1 shows a conventional LED 110 package which includes a semiconductor light emitter 112 which is typically 1 to 9 mm squared in surface area, and therefore around 1 to 3 mm in width w. The emitter has an electrically insulating backing 114, and, in this case, has packing 116 on either side of the emitter 112 allowing the LED to be mounted to a flat surface, for example by the use of transparent or translucent adhesive.

Also shown in FIG. 1 is a generally hemispherical cap 120 which is around 5 to 10 mm in radius. The cap is formed conveniently from a modified glass half ball lens of radius r. The LED package is adhered to or otherwise held to a flat face 122 of the cap 120, such that the middle of the emitter 112 is close to the geometric centre C of the cap.

The cap 120 has a reflective coating, for example a mirrored coating 124 formed around most of its curved surface 126, formed by vacuum vapour deposition or other known techniques. A portion 128 of the curved surface is free from the reflective coating, to form a light exit.

In use, the emitter 112 can emit light in all directions of an arc E of approximately 180 degrees, because the semiconductor die of the emitter 112 is essentially flat. Light emitted directly toward the exit 128 can escape through that unreflective area in a usable light cone L to be used in a microscope device, for example instrument 200 described in FIG. 2. However, as described above, limitations in the conventional optics available have led to the necessity for the cap 120 to be used to direct more light emitted across the arc E into the useable arc L. In this embodiment, light, for example light ray R is emitted from the emitter 112 and does not escape via the exit 128, so it is internally reflected within the glass cap 120 off the reflector 124 to return toward the emitter 112, whereat it is reflected off the emitter 112 and travels along path R' into the usable cone of light L. A similar occurrence takes place for the majority of light which does not at first escape along the cone L, in some instances, by multiple reflections at the reflector 124 and back onto the emitter 112.

Figure 2:
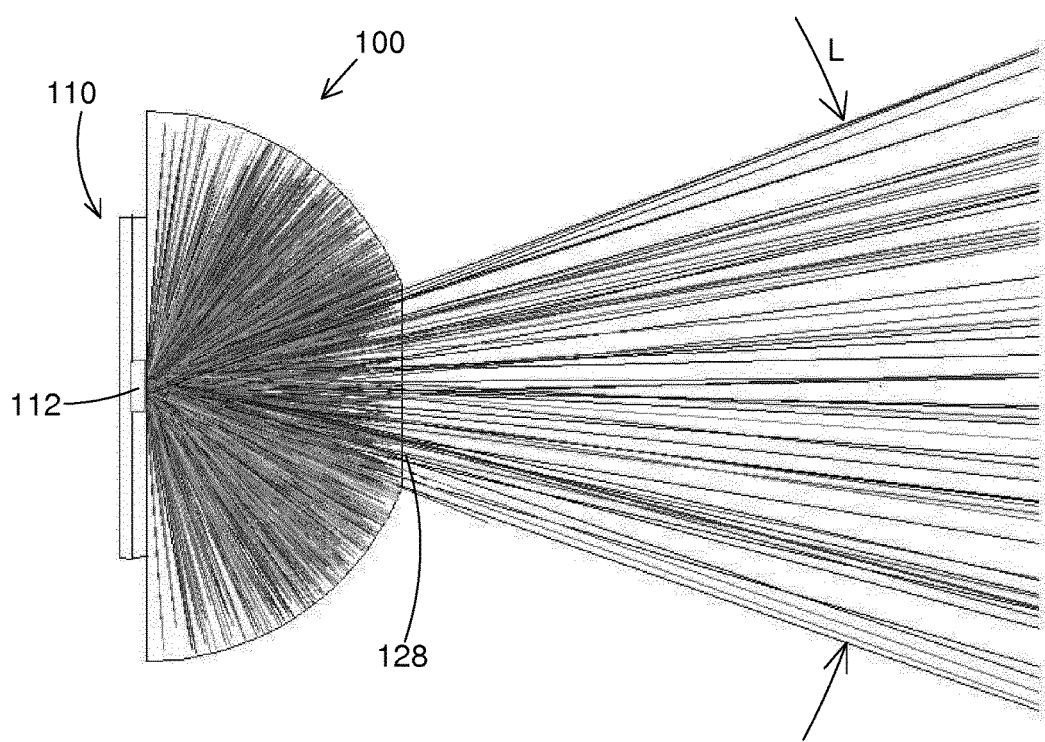
FIG. 2 is a ray diagram.

FIG. 2 shows a software generated ray trace diagram which defines the light paths of the LED arrangement shown schematically shown in FIG. 1. In particular, the reflective paths of light as a whole originating from the LED emitter 112 are more clearly visible. As described above, the rays emitted by the emitter 112 either pass through the exit or are reflected back to the LED via the reflector 124. Those that are reflected back will be redirected by the LED emitter, and a substantial portion of those redirected rays will subsequently lie within the central cone L and thus will pass through the exit 128.

Figure 3:
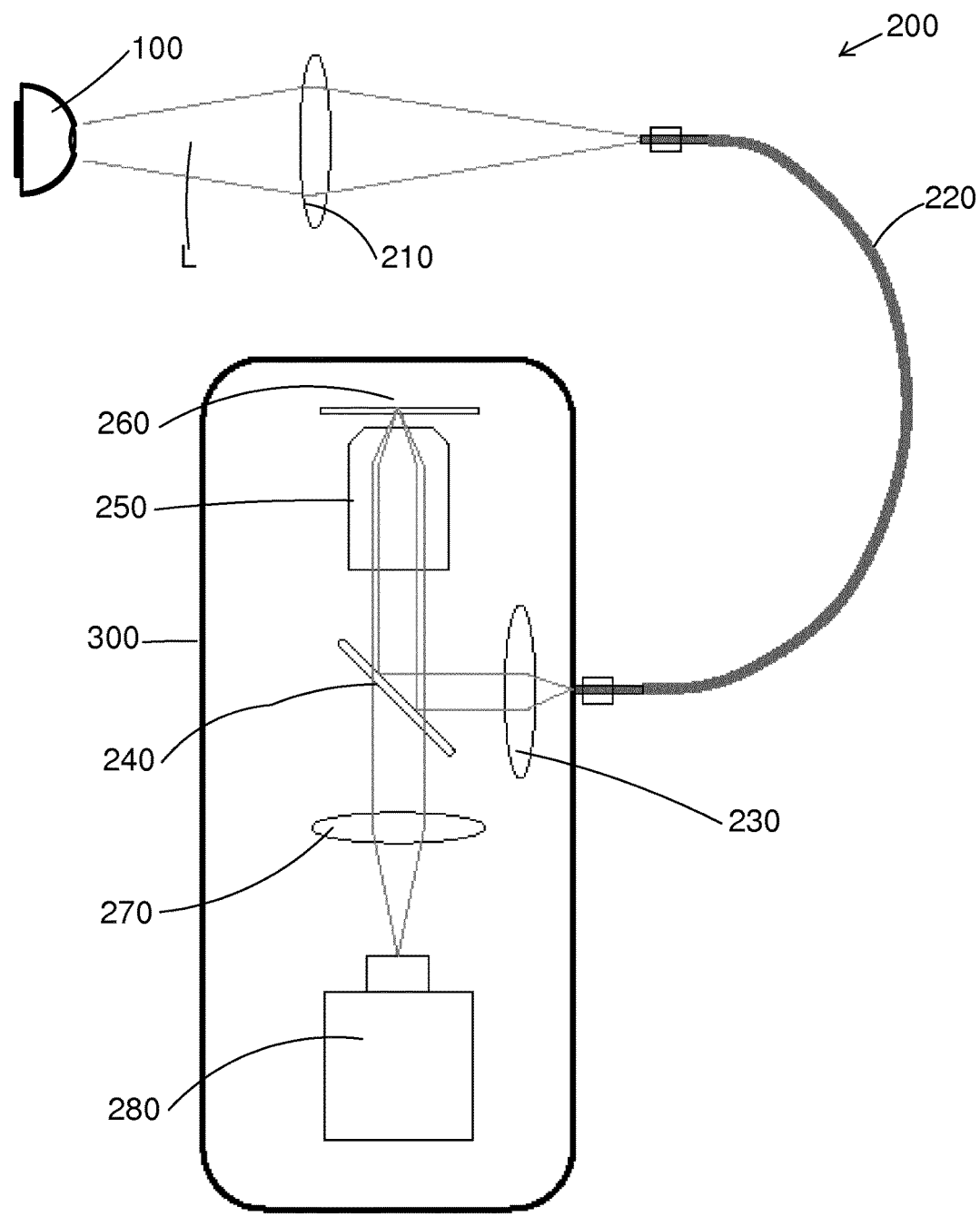
FIG. 3 shows microscopy device employing the LED arrangement shown in FIG. 1.

FIG. 3 shows schematically the LED arrangement 100 used in a microscope 200. In the embodiment, the cone of light L described above is focused by a convex lens 210 into a point, which point focused light enters an optical fibre 220. Light exiting the optical fibre 220 within a housing 300 passes through collimating lenses 230 which produce parallel rays of light which are in turn reflected by a polychroic mirror 240 toward and objective lens 250 and then refocused onto a sample 260. This imaging light is more intense than light which is collected from a conventional LED, and so more light (and a thereby a better image) travels back through the objective lens 250, straight through the mirror 240 and on to a tube lens 270 and finally into a camera 280 or other image capture means.

The concept proposed here involving the use of a reflective arcuate 'shield' surrounding the LED emitter to redirect light back on to the LED itself provides a significant improvement in the amount of usable light. The cone angle of the usable light cone L is preferably about 30 degrees, but an angle of about 20 to 60 degrees will provide suitable results. Preferably the cone angle is between 40 and 20 degrees. Although LED semiconductor emitters are formed from materials having various colours, it is proposed that white or near white semiconductor materials will provide the best diffuse reflective properties for the arrangement illustrated.

The emitter semiconductor 112 has a width, typically of 1 to 3 mm across. It has been found that the radius r of the half ball lens used should be about 10 to 20 times the width w of the emitter 112. The use of a solid material, for example glass, adjacent or in direct contact with the lens 120 is preferred because this arrangement allows heat to be conducted away from the LED more efficiently than if the LED were in air.

Although two embodiments have been described and illustrated, it will be apparent to the skilled addressee that additions, omissions and modifications are possible to those embodiments without departing from the scope of the invention claimed. For example, although a cap 120 in the form of a glass half ball lens has been described and illustrated, the concept will work with any approximately hemispherical shape, and any transparent or translucent material, which may include a band pass filter to reduce the bandwidth of the light in cone L. A reflective coating 124 has been described, but a separate shell, or applied film, for example, would suffice. The exit 128 could be formed by a mask used when applying the coating/film, or may be formed by removing a portion of the coating once applied. The light exit 128 is, most conveniently, circular to provide a regular conical usable light source. However, the exit 128 could be other shapes, for example the exit could be a slit, to provide a line of exit light, suitable for other optical techniques. For increased efficiency, the flat face 122 of the cap 120 could be made reflective also, at regions other than the emitter area 112. The light emitter 112 is preferably adhered to the flat face 122, but it could be held in place by friction, for example applied by a mechanical clamp. It is intended that the cap 120 is solid i.e. is formed from a homogeneous material such as glass. However other homogeneous materials could be employed, such as clear moulded plastics or composite materials which include liquid filled cavities.

The invention claimed is:

1. A microscopy instrument, the microscopy instrument comprising:
   a light emitting diode (LED) arrangement comprising:
      a light emitter having a width;
      a part-spherical, light transmissive cap in light communication with the light emitter, the cap including a curved surface having a radius, and the curved surface including a first portion configured to reflect light emitted from the light emitter and a second portion configured to allow light emitted from the light emitter to exit the cap; and
      an objective lens configured to focus light from the LED arrangement onto a sample,
      wherein a ratio of the radius of the curved surface of the cap to the width of the light emitter is between 10:1 and 20:1,
      wherein the first portion of the curved surface is adjacent the second portion of the curved surface along an exterior of the curved surface,
      wherein the curved surface of the cap is generally hemispherical,
      wherein the cap further includes a generally flat surface across a diametric base of the hemispherical surface, and
      wherein the light emitter is proximal to a central region of the generally flat surface.

2. The microscopy instrument of claim 1, wherein the light emitter is held immediately adjacent a central region of the generally flat surface or in touching contact therewith the first portion of the curved surface is configured to reflect light emitted from the light emitter back toward the light emitter.

3. The microscopy instrument of claim 1, wherein the first portion of the curved surface includes a mirrored coating, and wherein the second portion of the curved surface is not mirrored.

4. The microscopy instrument of claim 1, wherein the light emitter is spaced apart from the second portion of the curved surface by a distance such that an angle of divergence of light exiting the second portion of curved surface is less than 60 degrees.

5. The microscopy instrument of claim 4, wherein the angle of divergence is between 20 degrees and 40 degrees.

6. The microscopy instrument of claim 1, wherein the cap is formed of a solid homogeneous material.

7. The microscopy instrument of claim 6, wherein the solid homogenous material is glass.

8. The microscopy instrument of claim 1, wherein the cap includes a half ball lens including a reflective surface at the first portion of the curved surface and a non-reflective surface at the second portion of the curved surface.

9. The microscopy instrument of claim 1, further comprising:
   a convex lens configured to receive light from the LED arrangement;
   an optical fibre configured to receive light from the convex lens;
   a collimating lens configured to receive light from the optical fibre; and
   a polychroic mirror configured to receive light from the collimating lens and to reflect light toward the objective lens.

10. The microscopy instrument of claim 9, further comprising:
    a tube lens configured to receive light from the objective lens; and
    a camera configured to receive light from the tube lens and to capture an image of the sample.

11. The microscopy instrument of claim 1, further comprising a camera configured to receive light from the sample.

12. A microscopy instrument, the microscopy instrument comprising:
    a light emitting diode (LED) arrangement comprising:
       a semiconductor light emitter having a width; and
       a generally hemispherical, light transmissive cap in light communication with the semiconductor light emitter, the cap including a curved surface having a radius, and the curved surface including a first portion configured to reflect light emitted from the semiconductor light emitter back toward the semiconductor light emitter and a second portion configured to allow light emitted from the semiconductor light emitter to exit the cap;
    a convex lens configured to receive light from the LED arrangement;
    an optical fibre configured to receive light from the convex lens;
    a collimating lens configured to receive light from the optical fibre;
    a polychroic mirror configured to receive light from the collimating lens; and
    an objective lens configured to receive light from the polychroic mirror and to focus light onto a sample,
    wherein a ratio of the radius of the curved surface of the can to the width of the semiconductor light emitter is between 10:1 and 20:1,
    wherein the first portion of the curved surface is adjacent the second portion of the curved surface along an exterior of the curved surface,
    wherein the cap further includes a generally flat surface across a diametric base of the hemispherical surface, and
    wherein the light emitter is proximal to a central region of the generally flat surface.

13. The microscopy instrument of claim 12, further comprising:
    a tube lens configured to receive light from the objective lens; and
    a camera configured to receive light from the tube lens and to capture an image of the sample.

14. The microscopy instrument of claim 12, further comprising a camera configured to receive light from the sample.

* * * * *